United States Patent
Xu et al.

(10) Patent No.: US 12,428,748 B2
(45) Date of Patent: Sep. 30, 2025

(54) CRYSTAL GROWTH CONTROL METHOD AND APPARATUS, AND CRYSTAL GROWTH DEVICE

(71) Applicant: LONGI GREEN ENERGY TECHNOLOGY CO., LTD., Shaanxi (CN)

(72) Inventors: Zhanjun Xu, Shaanxi (CN); Rui Zhou, Shaanxi (CN); Qiao Li, Shaanxi (CN)

(73) Assignee: LONGI GREEN ENERGY TECHNOLOGY CO., LTD., Shaanxi (JP)

( * ) Notice: Subject to any disclaimer, the term of this patent is extended or adjusted under 35 U.S.C. 154(b) by 263 days.

(21) Appl. No.: 18/267,479

(22) PCT Filed: Dec. 16, 2021

(86) PCT No.: PCT/CN2021/138803
§ 371 (c)(1),
(2) Date: Jun. 15, 2023

(87) PCT Pub. No.: WO2022/143199
PCT Pub. Date: Jul. 7, 2022

(65) Prior Publication Data
US 2024/0060209 A1 Feb. 22, 2024

(30) Foreign Application Priority Data
Dec. 30, 2020 (CN) .......................... 202011611957.1

(51) Int. Cl.
*C30B 15/16* (2006.01)
*C30B 15/26* (2006.01)
*C30B 29/06* (2006.01)

(52) U.S. Cl.
CPC .............. *C30B 15/26* (2013.01); *C30B 15/16* (2013.01); *C30B 29/06* (2013.01)

(58) Field of Classification Search
CPC .......... C30B 15/16; C30B 15/26; C30B 29/04
See application file for complete search history.

(56) References Cited

U.S. PATENT DOCUMENTS

| 2001/0054376 A1 | 12/2001 | Miura et al. |
| 2009/0020069 A1* | 1/2009 | Standifer ................ C30B 33/02 |
| | | 117/204 |
| 2009/0068407 A1 | 3/2009 | Abrosimov et al. |

FOREIGN PATENT DOCUMENTS

| CN | 201428007 | 3/2010 |
| CN | 109112614 | 1/2019 |

(Continued)

OTHER PUBLICATIONS

International Search Report for Application No. PCT/CN2021/138803, mailed Mar. 1, 2022 (4 pages).

(Continued)

*Primary Examiner* — Robert M Kunemund
(74) *Attorney, Agent, or Firm* — NIXON PEABODY LLP; Jeffrey L. Costellia

(57) ABSTRACT

A crystal-growth controlling method and device, and a crystal growing apparatus, used for, in the process of growing a crystal by a pulling method, forming the crystal of the shape required by the cell side. The method includes: in a process of growing a crystal by the pulling method, acquiring a growth image of the crystal in real time, and extracting shape information of the crystal at a growth interface from the growth image, wherein the growth interface is where the crystal intersects with a raw-material melt liquid level; comparing the shape information of the crystal at the growth interface with shape information of the predetermined shape, to obtain a comparison result; and based on the comparison result, adjusting a shape of the crystal at the growth interface by using a laser.

15 Claims, 4 Drawing Sheets

(56) References Cited

FOREIGN PATENT DOCUMENTS

| | | | |
|---|---|---|---|
| JP | 62-30691 | * | 2/1987 |
| JP | 62182191 A | * | 8/1987 |
| TW | 200720495 | | 11/1994 |

OTHER PUBLICATIONS

Chinese Office Action for Application No. 202011611957.1, mailed Jan. 20, 2023 (6 pages).

* cited by examiner

CRYSTAL GROWTH CONTROL METHOD AND APPARATUS, AND CRYSTAL GROWTH DEVICE

CROSS REFERENCE TO RELEVANT APPLICATIONS

The present application claims the priority of the Chinese patent application filed on Dec. 30, 2020 before the Chinese Patent Office with the application number of 202011611957.1 and the title of "CRYSTAL GROWTH CONTROL METHOD AND APPARATUS, AND CRYSTAL GROWTH DEVICE", which is incorporated herein in its entirety by reference.

TECHNICAL FIELD

The present disclosure relates to the technical field of crystal drawing, and particularly relates to a crystal-growth controlling method and device, and a crystal growing apparatus.

BACKGROUND

In the photovoltaic industry, usually monocrystalline silicon rods are pulled by using the Czochralski single-crystal manufacturing method. But currently, the Czochralski single-crystal manufacturing method can merely grow silicon rods whose main body is of a cylindrical shape. When the monocrystalline silicon rods are used to fabricate solar cells subsequently, the cylindrical silicon rods are required to sequentially go through the cutting-off process, the square-cutting process and the slicing process to form the silicon wafers, to be used by the cell side. In the square-cutting process, the existing cylindrical silicon rods are cut to remove the four arcuate side skins, to obtain a square or approximate square structure. In an aspect, the square-cutting processing adds the processing of the silicon wafers used for solar cells. In another aspect, the returning-furnace and recycling of the side skins increases the overall cost of the crystal-pulling process.

SUMMARY

A purpose of the present disclosure is to provide a crystal-growth controlling method and device, and a crystal growing apparatus, to provide a technical solution of, in the process of growing a crystal by a pulling method, forming the crystal of the shape required by the cell side.

In the first aspect, the present disclosure provides a crystal-growth controlling method, a cross section of at least part of grown crystal having a predetermined shape, wherein the crystal-growth controlling method includes:
  in a process of growing a crystal by a pulling method, acquiring a growth image of the crystal in real time, and extracting shape information of the crystal at a growth interface from the growth image, wherein the growth interface is where the crystal intersects with a raw-material melt liquid level;
  comparing the shape information of the crystal at the growth interface with shape information of the predetermined shape, to obtain a comparison result; and
  based on the comparison result, adjusting a shape of the crystal at the growth interface by using a laser.

By using the above-described technical solution, the present disclosure includes, in the process of growing the crystal by the pulling method, acquiring the growth image of the crystal in real time, and extracting the shape information of the crystal at the growth interface from the growth image; comparing the shape information of the crystal at the growth interface with the shape information of the predetermined shape, to obtain a comparison result; and based on the comparison result, adjusting the shape of the crystal at the growth interface by using the laser. Accordingly, in the process of growing the crystal by the pulling method, the growing boundary of the crystal can be adjusted by using the laser light emitted by the laser, so that the shape of the grown crystal at the growth interface has the predetermined shape. Accordingly, the cross section of the crystal bars formed by using the crystal also has the predetermined shape. When the crystal bars are used to fabricate cell sheets, because the predetermined shape is a shape that matches with the silicon wafers used at the cell side, the crystal bars can directly undergo the slicing process to form the silicon wafers. As compared with the prior art, the present disclosure, by scanning the raw-material melt liquid level by using the laser, can enable the laser-scanned crystalline material to directly melt back into the melt, thereby increasing the utilization ratio of the polycrystalline-silicon raw material in the crucible, to draw out silicon rods that highly match with the shape of the downstream process, which can save the square-cutting manufacturing process of the crystal bars, or reduce the overall cost of the crystal-pulling process by reducing the side-skin returning-furnace.

In an alternative implementation, in the process of growing the crystal by the pulling method, the crystal rotates in a first direction relatively to the raw-material melt, and when the shape of the crystal at the growth interface is adjusted by using the laser, a laser light emitted by the laser irradiates the growth interface of the crystal.

By using the above-described technical solution, in the process of growing the crystal by the pulling method, the crystal rotates in the first direction relatively to the raw-material melt. At this point, the laser light emitted by the laser irradiates the growth interface of the crystal, to adjust the shape of the growth interface, so that the shape of the grown crystal at the growth interface satisfies the predetermined shape, so as to enable the cross-sectional shape of the obtained crystal bars to satisfy the predetermined shape.

In an alternative implementation, in the process of growing the crystal by the pulling method, the crystal has a first contour at the growth interface;
  the predetermined shape has a second contour at the growth interface; and
  the step of, based on the comparison result, adjusting the shape of the crystal at the growth interface by using the laser includes:
  based on the comparison result, controlling the laser to irradiate the growth interface of the crystal in a laser-light movement path, to adjust the shape of the crystal at the growth interface by using the laser, wherein the laser-light movement path is between the first contour and the second contour in a radial direction of the crystal at the growth interface.

By using the above-described technical solution, based on the laser-light movement path, the laser is controlled to irradiate the growth interface of the crystal. Because the laser-light movement path is between the first contour and the second contour in the radial direction of the crystal at the growth interface, along the laser-light movement path, the shape of the crystal at the growth interface can be adjusted into the predetermined shape, and the shape of the crystal at the growth interface is not excessively adjusted.

As an example, the laser-light movement path includes: a path from the first contour to the second contour in the radial direction of the crystal at the growth interface; and/or the laser-light movement path includes: a path from the second contour to the first contour in the radial direction of the crystal at the growth interface.

In an alternative implementation, the crystal is provided with a main-body part and a transition part, a cross section of the main-body part has the predetermined shape, and a size of a connection between the transition part and the main-body part matches with the predetermined shape; and the crystal-growth controlling method further includes:
in the process of growing the crystal by the pulling method, when the main-body part starts being grown, starting up the laser and controlling the laser to emit a laser light to the growth interface.

By using the above-described technical solution, in the process of growing the crystal by the pulling method, when the main-body part starts being grown, the laser is started up. Accordingly, resource wasting caused by premature starting-up of the laser can be prevented, thereby ensuring the effectiveness of the laser light. Erroneous adjustment of the crystal shape caused by premature starting-up of the laser can also be prevented.

In an alternative implementation, the predetermined shape is a regular polygon having right-angle sides or chamfers; and a maximum diameter of the connection between the transition part and the main-body part is equal to a diameter of a circumcircle of the predetermined shape.

By using the above-described technical solution, the predetermined shape may be particularly predetermined according to the shape of the silicon wafers, so that the shape of the finally obtained crystal matches with the shape of the silicon wafers used at the cell side. When the maximum diameter of the connection between the transition part and the main-body part is equal to the diameter of the circumcircle of the predetermined shape, that indicates that, at this point, by the shape adjustment on the main-body part by using the laser light, the shape of the main-body part obtained after the adjustment can be the same as the predetermined shape. If the maximum diameter of the connection between the transition part and the main-body part is less than the diameter of the circumcircle of the predetermined shape, after the shape adjustment on the main-body part by using the laser light, the shape of the obtained main-body part cannot satisfy the predetermined shape. If the maximum diameter of the connection between the transition part and the main-body part is greater than the diameter of the circumcircle of the predetermined shape, in the shape adjustment on the main-body part by using the laser light, the area of the laser-light-adjusted region is increased, which results in wasting of the laser-light resource.

In the second aspect, the present disclosure provides a crystal-growth controlling device, wherein the device includes a processor and a memory, the memory stores at least one computer instruction, and the computer instruction is loaded and executed by the processor to implement the steps of the crystal-growth controlling method.

In the third aspect, the present disclosure provides a crystal growing apparatus, wherein the crystal growing apparatus includes a single-crystal furnace, a laser and an image collector that are provided at the single-crystal furnace, and the crystal-growth controlling device stated above; and the crystal-growth controlling device is communicatively connected to the laser and the image collector.

The advantageous effects of the second aspect and the third aspect of the present disclosure and the implementations thereof are the same as the advantageous effects of the first aspect or any one of the alternative implementations of the first aspect, and are not discussed further herein.

BRIEF DESCRIPTION OF THE DRAWINGS

The drawings illustrated herein are intended to provide a further understanding of the present disclosure, and form part of the present disclosure. The illustrative embodiments of the present disclosure and their explanation are intended to interpret the present disclosure, and do not inappropriately limit the present disclosure. In the drawings.

DETAILED DESCRIPTION

Figure 1:
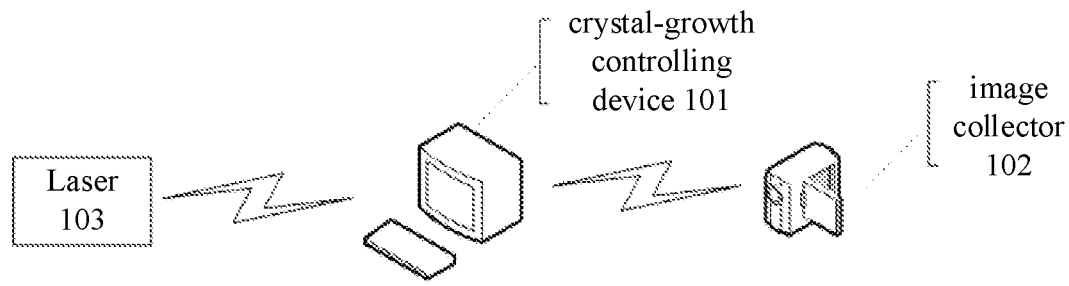
FIG. 1 schematically illustrates a schematic diagram of the communication between the components of a crystal growing apparatus according to an embodiment of the present disclosure.

The embodiments of the present disclosure will be described below with reference to the drawings. However, it should be understood that the description is merely illustrative, and is not intended to limit the scope of the present disclosure. Moreover, in the following description, the description on well-known structures and techniques are omitted, in order to prevent unnecessary confusion of the concepts of the present disclosure.

The drawings illustrate various schematic structural diagrams according to the embodiments of the present disclosure. The figures are not pulled to scale, wherein in order for clear illustration, certain details are exaggerated, and certain details might be omitted. The shapes of the regions and the layers shown in the figures and the relative sizes and position relations therebetween are merely exemplary, and, in practice, they might have deviations due to manufacturing tolerances or technical restrictions. In addition, a person skilled in the art may design other regions and layers that have different shapes, sizes and relative positions according to practical demands.

Moreover, the terms "first" and "second" are merely for the purpose of describing, and should not be construed as indicating or implying the degrees of importance or implicitly indicating the quantity of the specified technical features. Accordingly, the features defined by "first" and "second" may explicitly or implicitly include one or more of the features. In the description of the present disclosure, the meaning of "plurality of" is "two or more", unless explicitly and particularly defined otherwise. The meaning of "several" is "one or more", unless explicitly and particularly defined otherwise.

With the development of the global economics, the modernization has increasingly growing demands on high-efficiency energy sources. Photovoltaic electricity generation, as an environmentally friendly energy source and one of the major energy resources for the sustainable development of mankind, has continuously gained attention by countries all over the world and has been energetically developed. Monocrystalline silicon sheets, as a base material for fabricating cell sheets, have an extensive market demand.

In the photovoltaic industry, usually monocrystalline silicon rods are pulled by using the Czochralski single-crystal manufacturing method. But currently, the Czochralski single-crystal manufacturing method can merely grow silicon rods that are of a cylindrical shape. When the monocrystalline silicon rods are used to fabricate solar cells subsequently, the cylindrical silicon rods are required to sequentially go through the cutting-off process, the square-cutting process and the slicing process to form the silicon wafers, to be used by the cell side. In the square-cutting process, the existing cylindrical silicon rods are cut to remove the four arcuate side skins, to obtain a square or approximate square structure. In an aspect, the square-cutting processing adds the processing of the silicon wafers used for solar cells. In another aspect, the returning-furnace and recycling of the side skins increases the overall cost of the crystal-pulling process.

In view of the above, the present disclosure provides a crystal-growth controlling method, wherein the cross section of at least part of the crystal grown by using the crystal-growth controlling method has a predetermined shape. The crystal-growth controlling method is applied in a crystal growing apparatus.

FIG. 1 shows a schematic diagram of the communication between the components of a crystal growing apparatus according to an embodiment of the present disclosure. Referring to FIG. 1, the crystal growing apparatus 100 includes a single-crystal furnace, and a laser 103, an image collector 102 and a crystal-growth controlling device 101 that are provided at the single-crystal furnace. The crystal-growth controlling device 101 is communicatively connected to the laser 103 and the image collector 102.

Figure 2:
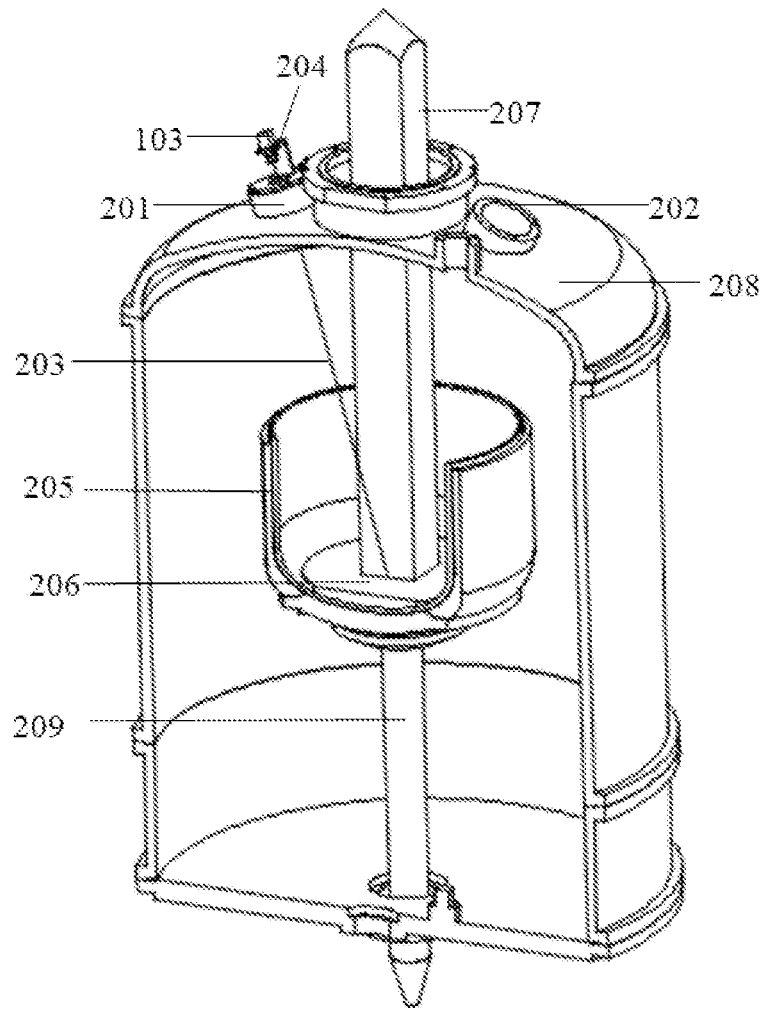
FIG. 2 schematically illustrates an internal sectional view of a single-crystal furnace according to an embodiment of the present disclosure.

In practical applications, referring to FIG. 2, the single-crystal furnace is provided with a first observation window 201 and a second observation window 202. The laser is provided at the first observation window 201, and is for emitting a laser light to the raw-material melt liquid level 206. The image collector is provided at the second observation window 202, and is for acquiring the growth image of the crystal in real time, and sending the growth image of the crystal to the crystal-growth controlling device. The crystal-growth controlling device is for extracting the shape information of the crystal at a growth interface from the growth image. Among them, the growth interface is the interface where the crystal intersects with the raw-material melt liquid level.

Referring to FIG. 2, a crucible 205 is inside the single-crystal furnace, a raw-material melt is placed inside the crucible 205, and the raw-material melt liquid level is 206. A lower shaft 209 is under the crucible 205, and in the growing process of the crystal 207, the lower shaft 209 drives the crucible 205 to continuously rotate. At this point, the crystal 207 rotates in the direction opposite to the rotation direction of the crucible 205, and continuously leaves the raw-material melt liquid level 206, to realize the growing of the crystal 207.

As an example, in the process of growing the crystal by the pulling method, the crystal rotates in a first direction relatively to the raw-material melt, the laser light emitted by the laser irradiates the edge of the growth interface of the crystal, and the crucible rotates in a second direction opposite to the first direction.

Figure 3:
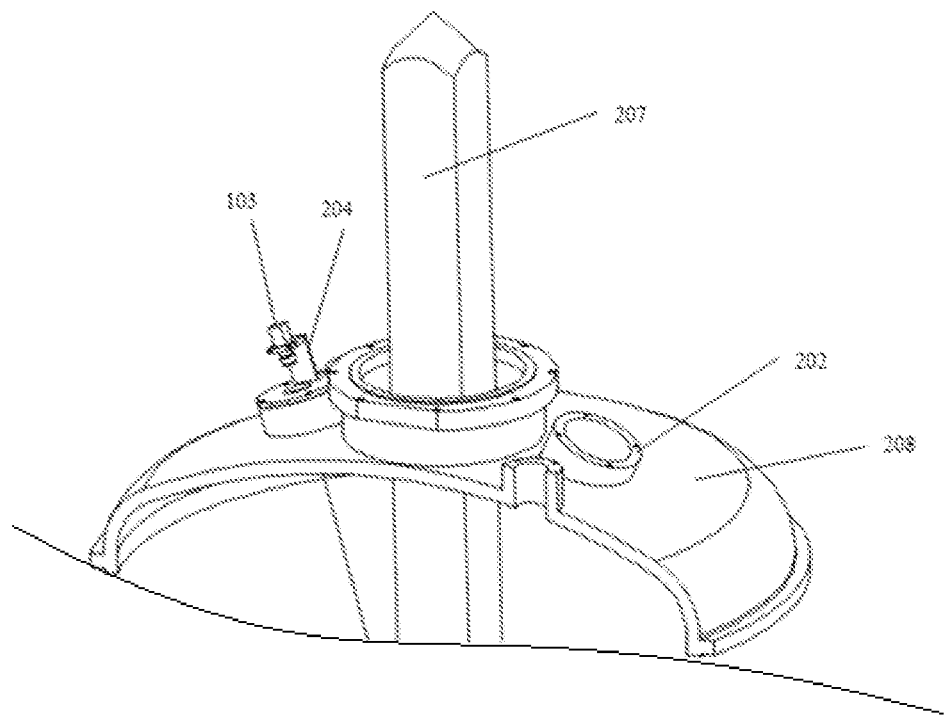
FIG. 3 schematically illustrates a schematic structural diagram of a single-crystal-furnace cover according to an embodiment of the present disclosure.

As a particular example, referring to FIG. 3, a single-crystal-furnace cover 208 is provided with a first observation window 201, the first observation window 201 is provided with a light transmitting glass, and the laser 103 is directly over the light transmitting glass. The first observation window 201 is provided with a laser installing base 204 on one side. As an example, the laser installing base 204 is detachably provided over the first observation window 201. The laser 103 is communicatively connected to the crystal-growth controlling device.

The crystal-growth controlling device controls the oscillating range of the laser, the intensity of the emitted laser light, and the on-state of the laser. At the late stage of the shoulder-circuiting of the crystal growth, when the diameter of the crystal 207 reaches the diameter of the circumcircle of the predetermined shape, the laser 103 is turned on. The raw-material melt liquid level 206 is irradiated by using the laser 103. Because the irradiated position of the raw-material melt liquid level 206 has a higher temperature, the silicon atoms at the laser-light-irradiated position are heated and melted, and the melted silicon melt melts back into the crucible melt. Particularly, in the process of growing the crystal by the pulling method, the crystal 207 can rotate anticlockwise and ascend, to cause the crystal to be continuously pulled out of the raw-material melt liquid level 206, and the laser light emitted by the laser 103 moves relatively to the crucible 205 in the radial direction of the crucible 205 at a constant speed, thereby controlling the cross-sectional shape of the crystal growth according to different demands.

Figure 4:
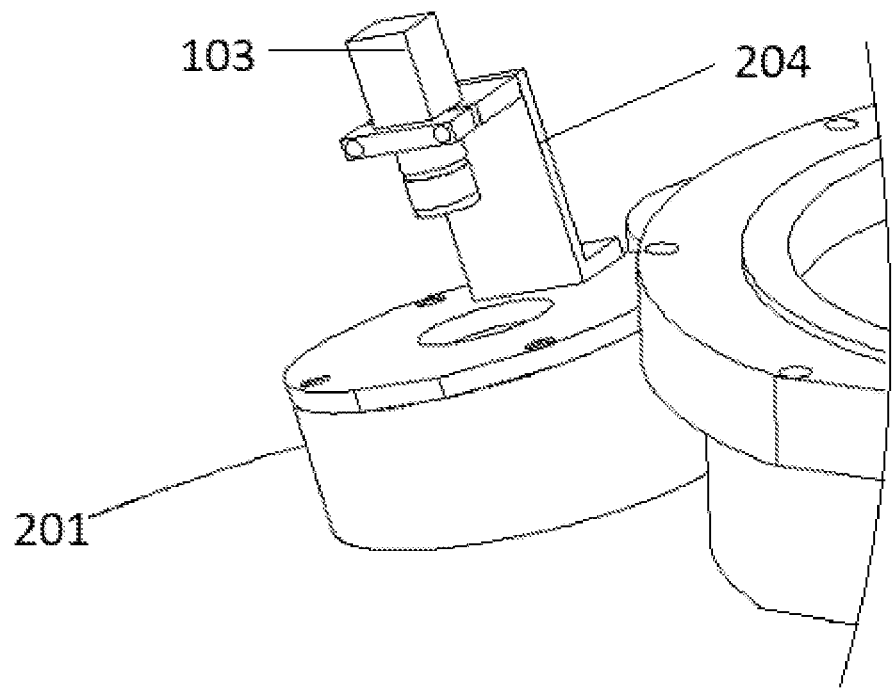
FIG. 4 schematically illustrates a schematic structural diagram of a laser and a laser installing base according to an embodiment of the present disclosure.

As an example, FIG. 4 shows a schematic structural diagram of a laser installing base according to an embodiment of the present disclosure. Referring to FIG. 4, the laser installing base 204 of a Z shape is provided at the single-crystal furnace, and one end of the laser installing base 204 is detachably provided at the first observation window 201. The other end of the laser installing base 204 is provided with an opening. The opening is used to contain the laser 103, and the opening coincides with the center of the first observation window 201, whereby the laser 103 is provided in the opening and, after passing through the first observation window 201, irradiates different positions of the raw-material melt liquid level. Referring to FIG. 2 and FIG. 3, the laser light emitted by the laser is 203. By the controlling by the crystal-growth controlling device 101, the shape of the crystal located at the melt liquid level is adjusted by using the laser light emitted by the laser, whereby the cross section of the grown crystal has the predetermined shape.

The laser may be a solid laser, a gas laser or a semiconductor laser. The solid laser refers to a laser that uses a solid laser material as the operation material, and its working medium is a crystal or glass as the matrix material uniformly doped by a small amount of an activating ion. The gas laser refers to a device that uses a gas as the operation material to generate laser light. The semiconductor laser is also referred to as a laser diode, and refers to a laser that uses a semiconductor material as the operation material.

As an example, the laser used in the embodiments of the present disclosure may be a carbon-dioxide laser tube. The carbon-dioxide laser tube is formed by the carbon dioxide gas and gases such as nitrogen and hydrogen, generates a laser-light beam with the laser wavelength of 10.6 μm and the power of above 20 kilowatts, can realize continuous operation, and is suitable for continuous laser-light irradiation on the raw-material melt in the crucible in the process of growing the crystal by the pulling method. As compared with other laser tubes, the carbon-dioxide laser tube has a higher power, and can quickly melt the crystal.

As an alternative implementation, the image collector is provided at the second observation window 202, and is communicatively connected to the crystal-growth controlling device. An image collecting region of the image collector includes at least the region where the crystal at the raw-material melt liquid level inside the crucible is located. The image collector is for collecting the growth image of the crystal in real time, and sending the collected image of the crystal to the crystal-growth controlling device. The crystal-growth controlling device is for extracting the shape information of the crystal at the growth interface from the growth image, wherein the growth interface refers to the interface where the crystal intersects with the raw-material melt liquid level. Furthermore, the crystal-growth controlling device stores the predetermined shape, and the predetermined shape is a shape that matches with the silicon wafers used at the cell side. As an example, the image collector may be any device or apparatus that can perform image collection, which is not particularly limited in the present disclosure, for example, a video camera.

The crystal-growth controlling device, by using the shape information of the crystal at the growth interface and the shape information of the predetermined shape, continuously adjusts the position of the irradiation at the raw-material melt liquid level by the laser, to realize the controlling on the laser-light path.

Figure 5:
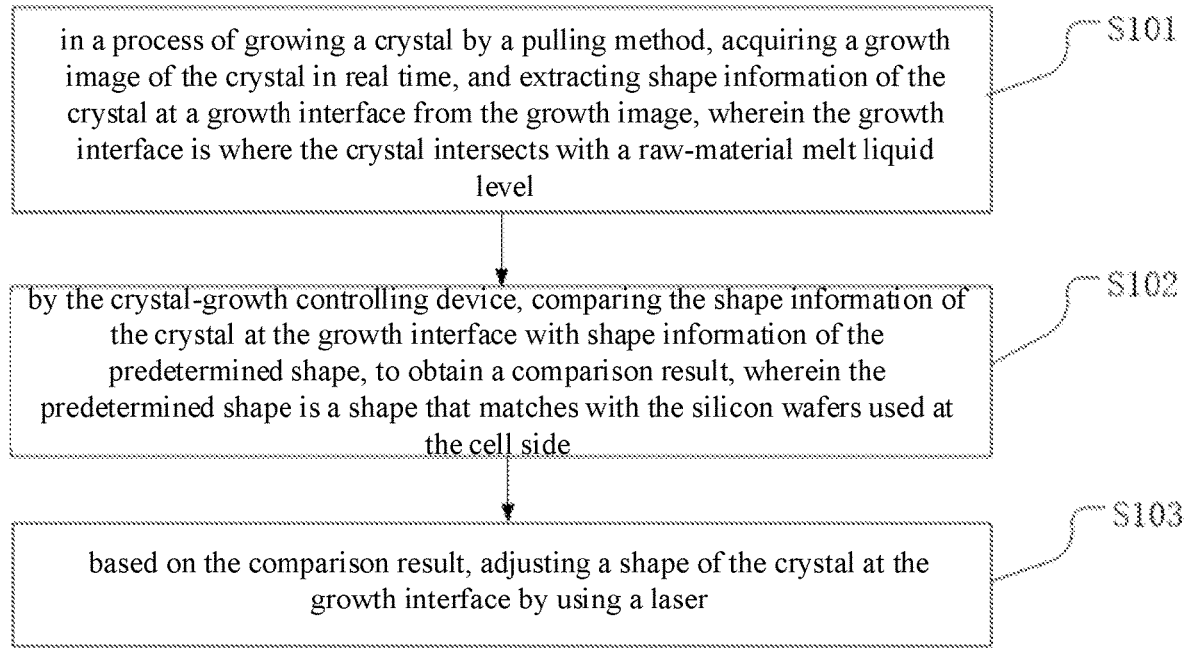
FIG. 5 schematically illustrates a flow chart of the steps of a crystal-growth controlling method according to an embodiment of the present disclosure.

Referring to FIG. 5, the crystal-growth controlling method includes the following steps:

S101: in a process of growing a crystal by a pulling method, by the crystal-growth controlling device, acquiring the growth image of the crystal in real time, and extracting shape information of the crystal at a growth interface from the growth image, wherein the growth interface is where the crystal intersects with the raw-material melt liquid level.

In practice, the crystal-growth controlling device continuously acquires the growth image of the crystal that is collected in real time by the image collector, and extracts the shape information of the crystal at the growth interface from the growth image in real time.

The shape information of the crystal at the growth interface may be a dimension parameter of the crystal contour of the crystal at the growth interface. For example, the shape information of the crystal at the growth interface may be the diameter of the crystal contour of the crystal at the growth interface.

S102: by the crystal-growth controlling device, comparing the shape information of the crystal at the growth interface with shape information of the predetermined shape, to obtain a comparison result.

The predetermined shape may be a shape that matches with the silicon wafers used at the cell side, and may also be a shape similar to the shape of the silicon wafers used at the cell side. For example, if the shape of the silicon wafers used at the cell side is a square having chamfers, the predetermined shape may be a square having chamfers that is the same as the shape of the silicon wafers, and may also be a square of the equal size of the silicon wafers. If the predetermined shape is a square having chamfers that is the same as the shape of the silicon wafers, subsequently the crystal bars formed by using the crystal may directly undergo the slicing process to form the silicon wafers. If the predetermined shape is a square of the equal size of the silicon wafers, subsequently it is required to process the crystal bars formed by using the crystal, and subsequently perform the slicing process to form the silicon wafers.

In the process of the comparing between the shape information of the crystal at the growth interface and the shape information of the predetermined shape by the crystal-growth controlling device, if the shape information of the crystal at the growth interface is less than the information of the predetermined shape, the crystal-growth controlling device is for controlling the laser to be in an off-state. If the shape information of the crystal at the growth interface is equal to the information of the predetermined shape, the crystal-growth controlling device is further for controlling the laser to start up. Accordingly, resource wasting caused by premature starting-up of the laser may be prevented, thereby ensuring the effectiveness of the laser scanning. Erroneous adjustment of the shape of the Czochralski-grown crystal caused by premature starting-up of the laser can also be prevented.

Figure 6:
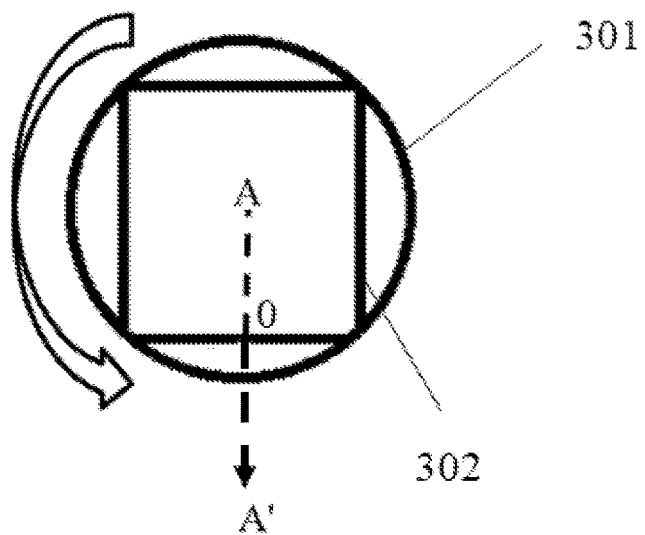
FIG. 6 schematically illustrates a schematic diagram of the shape of the crystal at the growth interface and the predetermined shape according to an embodiment of the present disclosure.

As a particular example, referring to FIG. 6, the shape of the crystal at the growth interface is 301, and the shape information of the predetermined shape is 302. When the diameters of the circumcircle of the predetermined shape 302 and of the shape 301 of the crystal at the growth interface are equal, the laser may be controlled to start up by using the crystal-growth controlling device.

In an embodiment of the present disclosure, in the process of growing the crystal by the pulling method, the crystal rotates in the first direction relatively to the raw-material melt. At this point, the laser light emitted by the laser irradiates the growth interface of the crystal, to adjust the shape of the edge of the growth interface, so that the shape of the grown crystal at the growth interface satisfies the predetermined shape, so as to enable the cross-sectional shape of the obtained crystal bars to satisfy the predetermined shape. Further, in order to more accurately adjust the shape of the crystal at the growth interface, and prevent excessively adjusting the shape of the crystal at the growth interface, the laser light emitted by the laser irradiates the edge of the growth interface of the crystal.

In the embodiment of the present disclosure, the laser light emitted by the laser irradiates the edge of the growth interface of the crystal, so the laser light does not irradiate the center area or the area adjacent to the center of the growth interface of the crystal, which prevents the laser light from irradiating the other areas of the crystal, to result in excessive adjustment of the shape of the crystal at the growth interface.

Particularly, in the process of the crystal growth, the crucible is driven by the lower shaft to rotate, and the crystal rotates in the direction opposite to the rotation direction of the crucible. After the crystal-growth controlling device determines that the shape information at the growth interface is greater than the shape information of the predetermined shape according to the shape information of the crystal at the growth interface and the shape information of the predetermined shape, the laser is started up. The crystal-growth controlling device is further for determining the movement speed of the laser according to the rotation direction and the rotation speed of the crucible and the rotation direction and the rotation speed of the crystal. When the laser is moving at the movement speed, the laser light emitted by the laser can irradiate different positions of the edge of the growth interface, to adjust the shape of the growth interface of the crystal, whereby the cross-sectional shape of the grown crystal satisfies the predetermined shape.

With the continuous rotating of the crucible and the crystal and the growing of the crystal, the growth image of the crystal acquired by the image collector continuously changes. At this point, the crystal-growth controlling device extracts the shape information of the crystal at the growth interface from the growth image of the crystal collected in real time by the image collector, and, according to the shape information of the crystal at the growth interface and the shape information of the predetermined shape, determines the real-time position information at the raw-material melt liquid level of the laser light emitted by the laser. Over time, the real-time position information at the raw-material melt liquid level of the laser light emitted by the laser forms a scanning path at the raw-material melt liquid level of the laser.

S103: based on the comparison result, adjusting a shape of the crystal at the growth interface by using a laser.

In the embodiments of the present disclosure, after comparing the shape information of the crystal at the growth interface and the shape information of the predetermined shape, to obtain the comparison result, and before, based on the comparison result, adjusting the shape of the crystal at the growth interface by using the laser, it is required to determine that the shape information of the crystal at the growth interface is greater than the shape information of the predetermined shape, or, in other words, the shape information of the crystal at the growth interface is greater than the shape information of the shape of the silicon wafers used at the cell side. That can ensure the accuracy of the adjustment of the shape of the crystal at the growth interface by the laser, and prevent, when the laser is scanning the raw-material melt liquid level, excessive adjustment on the shape of the crystal at the growth interface.

It can be understood that the laser is for, according to the comparison result, adjusting the shape of the crystal at the growth interface, so that the shape information of the final crystal matches with the shape of the silicon wafers used at the cell side. Therefore, the laser-light movement path at the growth interface of the irradiation by the laser may be controlled based on the comparison result. The laser-light movement path is between a first contour and a second contour in the radial direction of the crystal at the growth interface. In the process of growing the crystal by the pulling method, the contour of the crystal at the growth interface is the first contour, and the contour of the predetermined shape is the second contour.

Particularly, the laser-light movement path may be a path from the first contour to the second contour in the radial direction of the crystal at the growth interface. The laser-light movement path may also be a path from the second contour to the first contour in the radial direction of the crystal at the growth interface.

As a particular example, referring to FIG. 6, in the embodiment of the present disclosure, the crystal-growth controlling device causes the laser light emitted by the laser to, via a first light transmitting glass, irradiate the point O inside the crucible, wherein the point A is the center point of the crystal at the growth interface. By the controlling by the crystal-growth controlling device, the laser oscillates back and forth in the direction of extension of the straight line where A0 is located, i.e., oscillating in the direction of OA', and simultaneously the crystal rotates along with the crucible in the anticlockwise direction (i.e., the direction of the arrow in the figure). Because the irradiation by the laser light results in the increasing of the temperature of the point O, the silicon atoms are melted and melt back into the crucible. By the controlling on the oscillating direction and the laser-light intensity of the laser by the crystal-growth controlling device, it is ensured that the shape of the crystal at the growth interface grows with the predetermined shape.

As a particular example, in the steps S101-S103, the process of growing the crystal by the pulling method is used for growing the main-body part of the crystal, wherein the shapes of the cross-sections of the main-body part are substantially constant. In practice, before growing the main-body part of the crystal, it is required to go through the processes such as crystal seeding and shouldering. The conical shoulder approximately formed in the shouldering process corresponds to the transition part according to the embodiment of the present disclosure. When the transition part formed in the shouldering process is enlarged to a target diameter, the constant-diameter growth stage of the crystal is entered. At this point, the crystal-growth controlling method according to the embodiments of the present disclosure is used to control the shape of the crystal.

It can be known according to the above description that the crystal according to the embodiment of the present disclosure has a main-body part and a transition part, the cross section of the main-body part has the predetermined shape, and the size of the connection between the transition part and the main-body part matches with the predetermined shape. In the process of growing the crystal by the pulling method, when the main-body part starts being grown, the laser is started up and the laser is controlled to emit a laser light to the edge of the growth interface. Accordingly, resource wasting caused by premature starting-up of the laser may be prevented, thereby ensuring the effectiveness of the laser light. Erroneous adjustment of the crystal shape caused by premature starting-up of the laser can also be prevented. It can be understood that, in order to predetermine the predetermined shape according to the shape of the silicon wafers used at the cell side, to enable the cross-sectional shape of the finally obtained crystal to satisfy the shape of the silicon wafers used at the cell side, the predetermined shape may be a polygon. The predetermined shape may also be, according to the shape of the silicon wafers used at the cell side, set to be a shape having chamfers. As an example, the predetermined shape is a square having chamfers.

Figure 7:
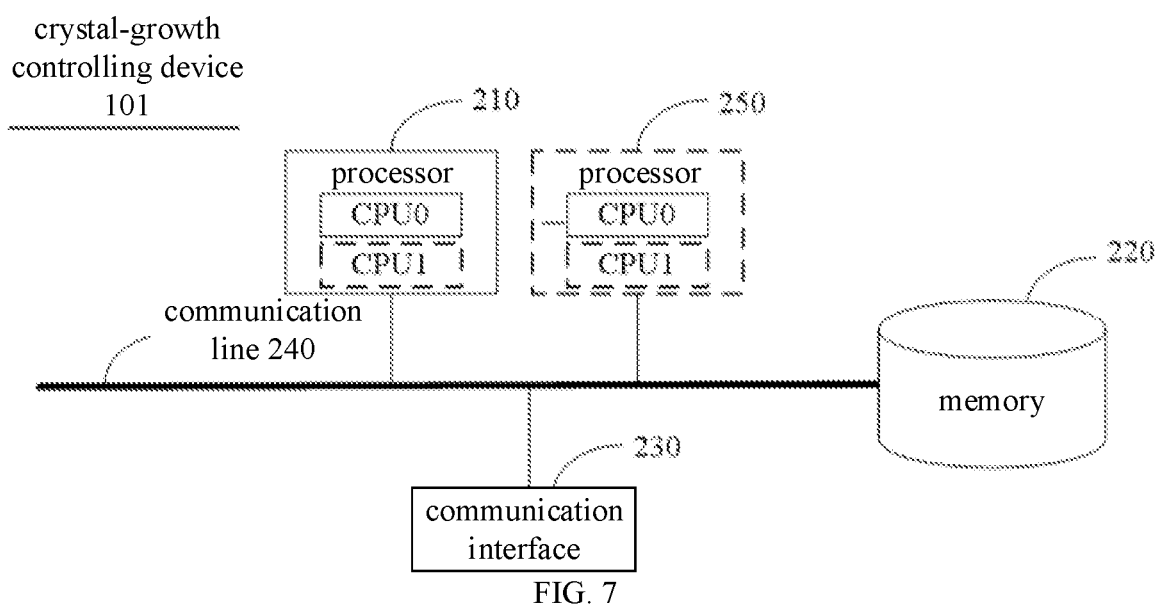
FIG. 7 schematically illustrates a structural diagram of a crystal-growth controlling device according to an embodiment of the present disclosure.

Accordingly, by using the predetermined shape as one of the factors for determining the laser scanning path at the raw-material melt liquid level of the laser, the shape information of the finally obtained crystal can match with the shape information of the silicon wafers used at the cell side. Based on the above description, the embodiments of the present disclosure include, in the process of growing the crystal by the pulling method, acquiring the growth image of the crystal in real time, and extracting the shape information of the crystal at the growth interface from the growth image; comparing the shape information of the crystal at the growth interface with the shape information of the predetermined shape, to obtain a comparison result; and based on the comparison result, adjusting the shape of the crystal at the growth interface by using the laser. Accordingly, in the process of growing the crystal by the pulling method, the growing boundary of the crystal can be adjusted by using the laser light emitted by the laser, so that the shape of the grown crystal at the growth interface has the predetermined shape. Accordingly, the cross section of the crystal bars formed by using the crystal also has the predetermined shape. When the crystal bars are used to fabricate cell sheets, because the predetermined shape is a shape that matches with the silicon wafers used at the cell side, the crystal bars can directly undergo the slicing process to form the silicon wafers. As compared with the prior art, the present disclosure, by scanning the raw-material melt liquid level by using the laser, can enable the laser-scanned crystalline material to directly melt back into the melt, thereby increasing the utilization ratio of the polycrystalline-silicon raw material in the crucible, to draw out silicon rods that highly match with the shape of the downstream process, which can save the square-cutting manufacturing process of the crystal bars, or reduce the overall cost of the crystal-pulling process by reducing the side-skin returning-furnace. Referring to FIG. 7, the actions performed by the crystal-growth controlling device may be stored in a memory 220 of the crystal-growth controlling device as a computer instruction, and the computer instruction stored in the memory 520 is executed by a processor 510.

The crystal-growth controlling device 101 includes: a processor 210 and a communication interface 230, the communication interface 230 is coupled to the processor 210, and the processor 210 is for executing a computer program or instruction. The crystal-growth controlling device 101 may communicate with the laser and a driving component of the image collector via the communication interface 230.

As shown in FIG. 7, the processor 210 may be a generic central processing unit (CPU), a microprocessor, and an application-specific integrated circuit (ASIC), or one or more integrated circuits for controlling the execution of the program according to the present disclosure. The communication interface 230 may be one or more communication interfaces. The communication interface 230 may employ any device such as a transceiver, and is for communicating with another device or a communication network.

As shown in FIG. 7, the crystal-growth controlling device 101 may further include a communication line 240. The communication line 240 may include a passage that transmit information between the above-described components.

Optionally, as shown in FIG. 7, the crystal-growth controlling device 101 may further include a memory 220. The memory 220 is for storing a computer instruction that implements the solution according to the present disclosure, and the implementation is controlled by the processor 210. The processor 210 is for executing the computer instruction stored in the memory 220.

As shown in FIG. 7, the memory 220 may be a Read-Only Memory (ROM) or another type of static storage device that can store static information and instructions, and a Random Access Memory (RAM) or another type of dynamic storage device that can store information and instructions, may also be an Electrically Erasable Programmable Read Only Memory (EEPROM), a Compact Disc Read-Only Memory (CD-ROM) or another optical disk storage, optical disk storage (including a compressed optical disk, a laser optical disk, an optical disk, a Digital Versatile Disc, a blue-ray optical disk and so on), magnetic-disk storage medium or another magnetic storage device, or any other mediums that can be used to carry or store a desired program code in the form of an instruction or a data structure and can be accessed by a computer, but is not limited thereto. The memory 220 may exist independently, and be connected to the processor 210 via the communication line 240. The memory 220 may also be integrated with the processor 210.

Optionally, the computer instruction according to the embodiments of the present disclosure may also be referred to as an application program code, which is not particularly limited in the embodiments of the present disclosure.

In a particular implementation, as an embodiment, as shown in FIG. 7, the processor 210 may include one or more CPUs, for example, the CPU0 and the CPU1 in FIG. 7.

In a particular implementation, as an embodiment, as shown in FIG. 7, the crystal-growth controlling device 101 may include a plurality of processors 210, for example, the processor 210 and the processor 250 in FIG. 7. Each of those processors may be a single-core processer, and may also be a multi-core processor.

An embodiment of the present disclosure further provides a computer-readable storage medium. The computer-readable storage medium stores an instruction, and the instruction, when executed, implements the functions performed by the crystal-growth controlling device in the above embodiments.

The above embodiments may be implemented totally or partially by software, hardware, firmware or any combination thereof. When they are implemented by software, they may be implemented totally or partially in the form of a computer program product. The computer program product includes one or more computer programs or instructions. When the computer programs or instructions are loaded and executed in a computer, they totally or partially perform the process or functions according to the embodiments of the present disclosure. The computer may be a general-purpose computer, a special-purpose computer, a computer network, a terminal, a user device or another programmable device. The computer instructions or instructions may be stored in a computer-readable storage medium, or be transmitted from a computer-readable storage medium to another computer-readable storage medium. For example, the computer programs or instructions may be transmitted from a web site, computer, server or data center to another web site, computer, server or data center in a wired or wireless manner. The computer-readable storage medium may be any usable medium that can be accessed by a computer or a data storage device that integrates one or more usable mediums such as a server and a data center. The usable medium may be a magnetic medium such as a floppy disk, a hard disk and a magnetic tape, may also be an optical medium such as a Digital Video Disc (DVD), and may also be a semiconductor medium such as a Solid State Disk (SSD).

Although the present disclosure has been described herein with reference to the embodiments, in the process of the implementation of the claimed subject matters of the present disclosure, a person skilled in the art can comprehend and implement other variations of the embodiments of the present disclosure by reading the drawings, the disclosure and the appended claims. In the claims, the word "comprising" does not exclude other component parts or steps, and "a" or "an" does not exclude the cases of plurality. A single processor or other unit may perform a plurality of functions listed in the claims. Different dependent claims set forth certain measures, but that does not indicate that those measures cannot be combined to result in a good effect.

Although the present disclosure has been described herein with reference to the embodiments, in the process of the implementation of the claimed subject matters of the present disclosure, a person skilled in the art can comprehend and implement other variations of the embodiments of the present disclosure by reading the drawings, the disclosure and the appended claims. In the claims, the word "comprising" does not exclude other component parts or steps, and "a" or "an" does not exclude the cases of plurality. A single processor or other unit may perform a plurality of functions listed in the claims. Different dependent claims set forth certain measures, but that does not indicate that those measures cannot be combined to result in a good effect.

Although the present disclosure has been described with reference to the particular features and the embodiments thereof, apparently, they may have various modifications and combinations without departing from the spirit and scope of the present disclosure. Correspondingly, the description and the drawings are merely illustrative description on the present disclosure defined by the appended claims, and are deemed as having already covered any and all of modifications, variations, combinations and equivalents within the scope of the present disclosure. Apparently, a person skilled in the art may make various modifications and variations on the present disclosure without departing from the spirit and the scope of the present disclosure. Accordingly, if those modifications and variations on the present disclosure fall within the scope of the claims of the present disclosure and equivalents thereof, then the present disclosure is also intended to encompass those modifications and variations.

The invention claimed is:

1. A crystal-growth controlling method, a cross section of at least part of grown crystal having a predetermined shape, wherein the crystal-growth controlling method comprises:
   in a process of growing a crystal by a pulling method, acquiring a growth image of the crystal in real time, and extracting shape information of the crystal at a growth interface from the growth image, wherein the growth interface is where the crystal intersects with a raw-material melt liquid level;
   comparing the shape information of the crystal at the growth interface with shape information of the predetermined shape, to obtain a comparison result; and
   based on the comparison result, adjusting a shape of the crystal at the growth interface by using a laser;
   wherein in the process of growing the crystal by the pulling method, the crystal rotates in a first direction relatively to the raw-material melt, and when the shape of the crystal at the growth interface is adjusted by using the laser, a laser light emitted by the laser irradiates the growth interface of the crystal;
   wherein in the process of growing the crystal by the pulling method, the crystal has a first contour at the growth interface;
   the predetermined shape has a second contour; and
   the step of, based on the comparison result, adjusting the shape of the crystal at the growth interface by using the laser comprises:
   based on the comparison result, controlling the laser to irradiate the growth interface of the crystal in a laser-light movement path, to adjust the shape of the crystal at the growth interface by using the laser, wherein the laser-light movement path is between the first contour and the second contour in a radial direction of the crystal at the growth interface.

2. The crystal-growth controlling method according to claim 1, wherein the laser-light movement path comprises: a path from the first contour to the second contour in the radial direction of the crystal at the growth interface; and/or
   the laser-light movement path comprises: a path from the second contour to the first contour in the radial direction of the crystal at the growth interface.

3. The crystal-growth controlling method according to claim 1, wherein the raw-material melt is placed in a crucible, and in the process of growing the crystal by the pulling method, the crucible rotates in a second direction opposite to the first direction.

4. The crystal-growth controlling method according to claim 1, wherein the crystal is provided with a main-body part and a transition part, a cross section of the main-body part has the predetermined shape, and a size of a connection between the transition part and the main-body part matches with the predetermined shape; and
   the crystal-growth controlling method further comprises:
   in the process of growing the crystal by the pulling method, when the main-body part starts being grown, starting up the laser and controlling the laser to emit a laser light to the growth interface.

5. The crystal-growth controlling method according to claim 4, wherein the predetermined shape is a regular polygon having right-angle sides or chamfers; and
   a maximum diameter of the connection between the transition part and the main-body part is equal to a diameter of a circumcircle of the predetermined shape.

6. A crystal-growth controlling device, wherein the device comprises a processor and a memory, the memory stores at least one computer instruction, and the computer instruction is loaded and executed by the processor to implement the steps of the crystal-growth controlling method according to claim 1.

7. A crystal growing apparatus, wherein the crystal growing apparatus comprises a single-crystal furnace, a laser and an image collector that are provided at the single-crystal furnace, and the crystal-growth controlling device according to claim 6; and
   the crystal-growth controlling device is communicatively connected to the laser and the image collector.

8. The crystal growing apparatus according to claim 7, wherein the single-crystal furnace is provided with a first observation window and a second observation window; and
   the laser is provided at the first observation window, and is for emitting a laser light to the raw-material melt liquid level, and the image collector is provided at the second observation window, and is for acquiring the growth image of the crystal in real time.

9. The crystal growing apparatus according to claim 7, wherein the crystal growing apparatus further comprises a laser installing base, and the laser is rotatably connected to the laser installing base.

10. The crystal growing apparatus according to claim 7, wherein the crystal-growth controlling device is for controlling a laser-light movement path of the laser at the growth interface of the crystal.

11. The crystal-growth controlling method according to claim 1, wherein the raw-material melt is placed in a crucible, and in the process of growing the crystal by the pulling method, the crucible rotates in a second direction opposite to the first direction.

12. The crystal-growth controlling method according to claim 2, wherein the raw-material melt is placed in a crucible, and in the process of growing the crystal by the pulling method, the crucible rotates in a second direction opposite to the first direction.

13. The crystal-growth controlling method according to claim 1, wherein the crystal is provided with a main-body part and a transition part, a cross section of the main-body part has the predetermined shape, and a size of a connection between the transition part and the main-body part matches with the predetermined shape; and
   the crystal-growth controlling method further comprises:

in the process of growing the crystal by the pulling method, when the main-body part starts being grown, starting up the laser and controlling the laser to emit a laser light to the growth interface.

14. The crystal-growth controlling method according to claim 1, wherein the crystal is provided with a main-body part and a transition part, a cross section of the main-body part has the predetermined shape, and a size of a connection between the transition part and the main-body part matches with the predetermined shape; and the crystal-growth controlling method further comprises:
in the process of growing the crystal by the pulling method, when the main-body part starts being grown, starting up the laser and controlling the laser to emit a laser light to the growth interface.

15. The crystal-growth controlling method according to claim 2, wherein the crystal is provided with a main-body part and a transition part, a cross section of the main-body part has the predetermined shape, and a size of a connection between the transition part and the main-body part matches with the predetermined shape; and the crystal-growth controlling method further comprises:
in the process of growing the crystal by the pulling method, when the main-body part starts being grown, starting up the laser and controlling the laser to emit a laser light to the growth interface.

* * * * *